(12) United States Patent
Noda et al.

(10) Patent No.: US 6,559,377 B1
(45) Date of Patent: May 6, 2003

(54) GROUNDED FLEXIBLE PRINTED CIRCUITRY WITH IMPROVED IMPEDANCE CHARACTERISTICS

(75) Inventors: Atsuhito Noda, Hachiohji (JP); Shigeyuki Hoshikawa, Yamato (JP); Shigeru Ando, Yamato (JP)

(73) Assignee: Molex Incorporated, Lisle, IL (US)

( * ) Notice: Subject to any disclaimer, the term of this patent is extended or adjusted under 35 U.S.C. 154(b) by 681 days.

(21) Appl. No.: 08/932,545

(22) Filed: Sep. 17, 1997

(30) Foreign Application Priority Data

Oct. 4, 1996 (JP) .............................. 8-283262

(51) Int. Cl.⁷ ............................ H01B 11/06; H01B 7/29
(52) U.S. Cl. ................. 174/36; 174/117 F; 174/117 M; 174/254; 333/238; 333/1
(58) Field of Search ............... 174/36, 254, 117 F, 174/117 M; 439/67, 77; 361/749; 333/238

(56) References Cited

U.S. PATENT DOCUMENTS

| | | | |
|---|---|---|---|
| 4,798,918 A | 1/1989 | Kabadi et al. | 174/36 |
| 5,300,899 A | 4/1994 | Suski | 331/1 |
| 5,675,299 A | 10/1997 | Suski | 333/1 |
| 5,682,124 A | 10/1997 | Suski | 333/1 |

FOREIGN PATENT DOCUMENTS

| | | | |
|---|---|---|---|
| DE | 2 154 814 | 5/1973 | |
| EP | 0 446 038 A2 | 9/1991 | |
| FR | 2 613 539 | 10/1988 | |
| WO | WO 87/00679 | 1/1987 | H01B/7/08 |

*Primary Examiner*—Hung V. Ngo
(74) *Attorney, Agent, or Firm*—Charles S. Cohen

(57) ABSTRACT

A flexible printed circuitry member includes an elongated flexible insulating substrate with a plurality of signal conductors extending longitudinally along one side of the substrate. A grounding grid having a substantially random geometric pattern is disposed on the opposite side of the substrate.

17 Claims, 4 Drawing Sheets

PRIOR ART

GROUNDED FLEXIBLE PRINTED CIRCUITRY WITH IMPROVED IMPEDANCE CHARACTERISTICS

FIELD OF THE INVENTION

This invention generally relates to the art of electrical cables and, particularly, to flexible printed circuitry or cable ("FPC"). Specifically, the invention relates to grounded flexible printed circuitry wherein a grounding grid provides improved impedance characteristics for high frequency signals transmitted by the circuitry.

BACKGROUND OF THE INVENTION

Electrical circuitry often is provided with protection from electromagnetic interference (EMI) and radio frequency interference (RFI) emanating from or entering the system. Although EMI and RFI now are often used interchangeably, EMI has been used to connote energy occurring anywhere in the electromagnetic spectrum and RFI has been limited to interference in the radio communication band. EMI energy can be generated outside as well as inside the system. External EMI energy can interfere with the operation of electronic equipment within the system, while internal EMI energy can create "cross talk" and "noise" which can cause erroneous data transmission.

Electrical connectors are particularly prone to disruptions from EMI energy because of the numerous contact areas and openings for electrical terminals and cables, but numerous electrical connectors have been designed with shielding that is effective against EMI/RFI energy. On the other hand, it often is desirable to have a shielded cable as well as shielded connectors.

Conventional flexible printed circuitry in the form of a cable includes a flexible insulating base or substrate having a plurality of signal conductors extending longitudinally along one or both sides of the substrate. If it is desired to shield the flexible printed circuitry, the signal conductors typically are disposed on one side of the substrate and a ground circuit is disposed on the opposite side of the substrate. For instance, it is known to cover the opposite side of the substrate with a layer of metal such as copper for shielding and grounding purposes. However, it has been found that such metal layers significantly decrease the flexibility of the flexible printed circuitry. Consequently, a conductive wire mesh or grounding grid has been used on a side of the substrate opposite the signal conductors for grounding and shielding purposes. Such grounding grids are formed by a plurality of straight ground conductors which crisscross each other to define symmetrical open spaces therebetween.

One of the problems with the prior art grounding grids for use in flexible printed circuitry is that they do not provide a substantially constant impedance for the signal conductors extending longitudinally of the cable. More specifically, the grounding grid is formed by ground conductors which are printed or otherwise deposited on one side of the flexible insulating substrate of the cable. The ground conductors are in the form of a screen or grid with a plurality of generally straight, parallel ground conductors intersecting other parallel ground conductors at regular intervals to define equal-in-shape and equal-in-size open spaces between the conductor wires in a regular geometric pattern. Because of the regularity of the pattern, the signal conductors traverse different conductor sequences running longitudinally of the cable at different lateral positions on the cable, thus causing each conductor to have a different impedance. The characteristic impedance of flexible printed circuitry can affect the integrity of the signals travelling in the cable, particularly for high frequency signals. The creation of different conductor impedance by regular-patterned grounding grids is explained more graphically in the Specification in relation to FIGS. 3 and 4.

The present invention is directed to solving these problems by use of a grounding grid having a novel random geometric pattern.

SUMMARY OF THE INVENTION

An object, therefore, of the invention is to provide a new flexible printed circuitry having improved impedance characteristics.

In the exemplary embodiment of the invention, the flexible printed circuitry includes an elongated flexible insulating substrate. A plurality of signal conductors extend longitudinally along at least one side of the insulating substrate. A grounding grid is disposed on the insulating substrate. The grounding grid has a random or substantially random geometric pattern to provide substantially constant impedance for the signal conductors lengthwise of the FPC.

As disclosed herein, the signal conductors are disposed on one side of the insulating substrate, and the grounding grid is disposed on an opposite side of the substrate. The signal conductors extend generally parallel to each other longitudinally of the substrate. The grounding grid covers substantially the entirety of the substrate.

The grounding grid is formed by a plurality of intersecting ground conductors defining open spaces therebetween. According to the invention, the intersections of the ground conductors are in a random pattern to define unequal-in-shape and unequal-in-size open spaces therebetween.

Other objects, features and advantages of the invention will be apparent from the following detailed description taken in connection with the accompanying drawings.

BRIEF DESCRIPTION OF THE DRAWINGS

The features of this invention which are believed to be novel are set forth with particularity in the appended claims. The invention, together with its objects and the advantages thereof, may be best understood by reference to the following description taken in conjunction with the accompanying drawings, in which like reference numerals identify like elements in the figures and in which:

DETAILED DESCRIPTION OF THE PREFERRED EMBODIMENT

Figure 1:
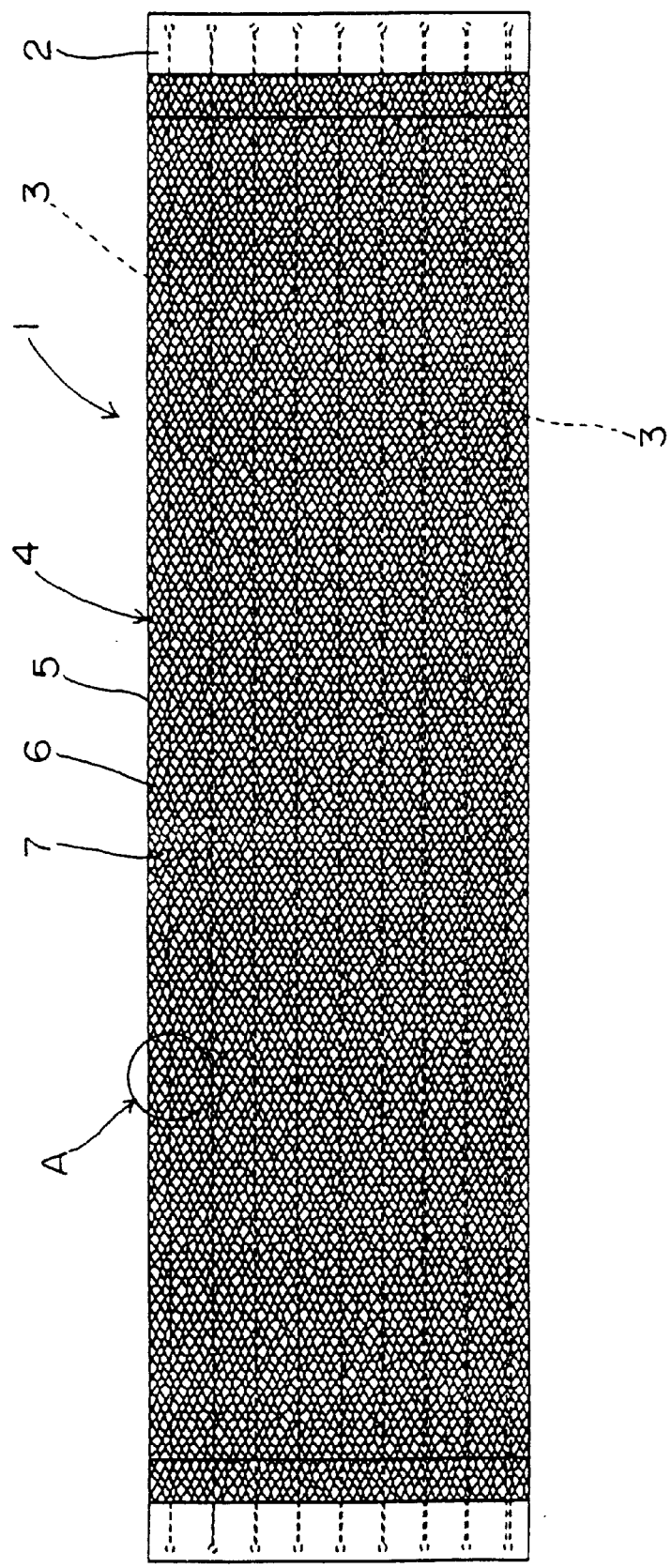
FIG. 1 is a plan view of flexible printed circuitry incorporating the concepts of the invention.
Figure 2:
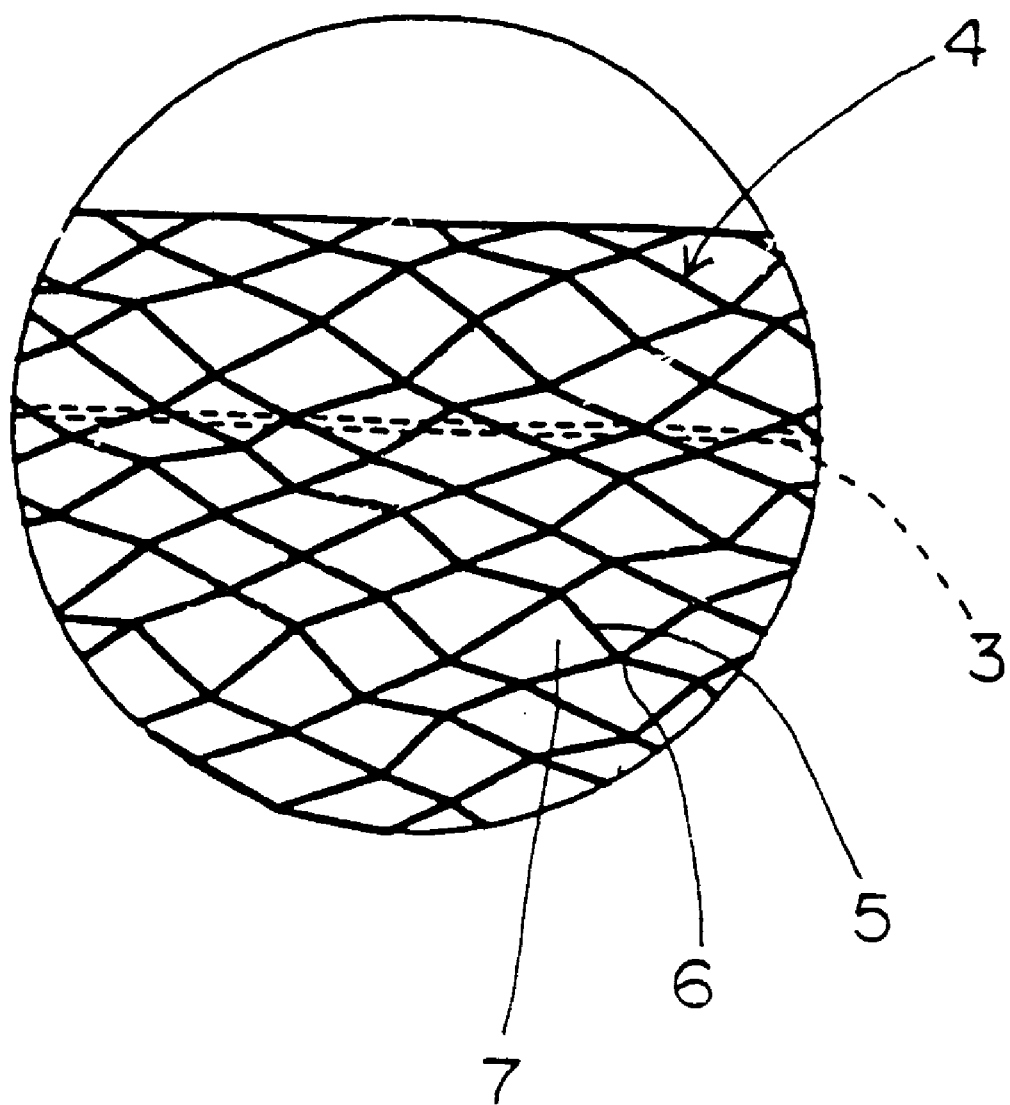
FIG. 2 is an enlarged view of a portion of the flexible printed circuitry circled and indicated at "A" in FIG. 1.

Referring to the drawings in greater detail, and first to FIGS. 1 and 2, flexible printed circuitry or FPC, generally designated 1, is shown according to the present invention. The flexible printed circuitry includes an elongated flexible insulating substrate or base 2, with a plurality of signal conductors 3 extending longitudinally along the substrate on one side thereof. A grounding grid 4, generally, is disposed on the opposite side of the insulating substrate.

Preferably, signal conductors 3 run parallel to each other longitudinally along substrate 2 and are disposed on one side of the substrate. Grounding grid 4 is disposed on an opposite side of the substrate and covers substantially the entire area of the substrate except for the opposite terminal ends of the circuitry.

As seen best in FIG. 2, grounding grid 4 has a random or substantially random geometric pattern. As is known, such grounding grids are formed by a plurality of ground conductors or ground leads 5 defining a plurality of intersections 6, with open spaces 7 therebetween. The ground conductors or leads are printed or otherwise deposited on one side of substrate 2. According to the invention and as clearly seen in FIG. 2, the intersections 6 of ground conductors 5 are in a random or substantially random pattern. Consequently, open spaces 7 are both unequal-in-shape and unequal-in-size.

Figure 3:
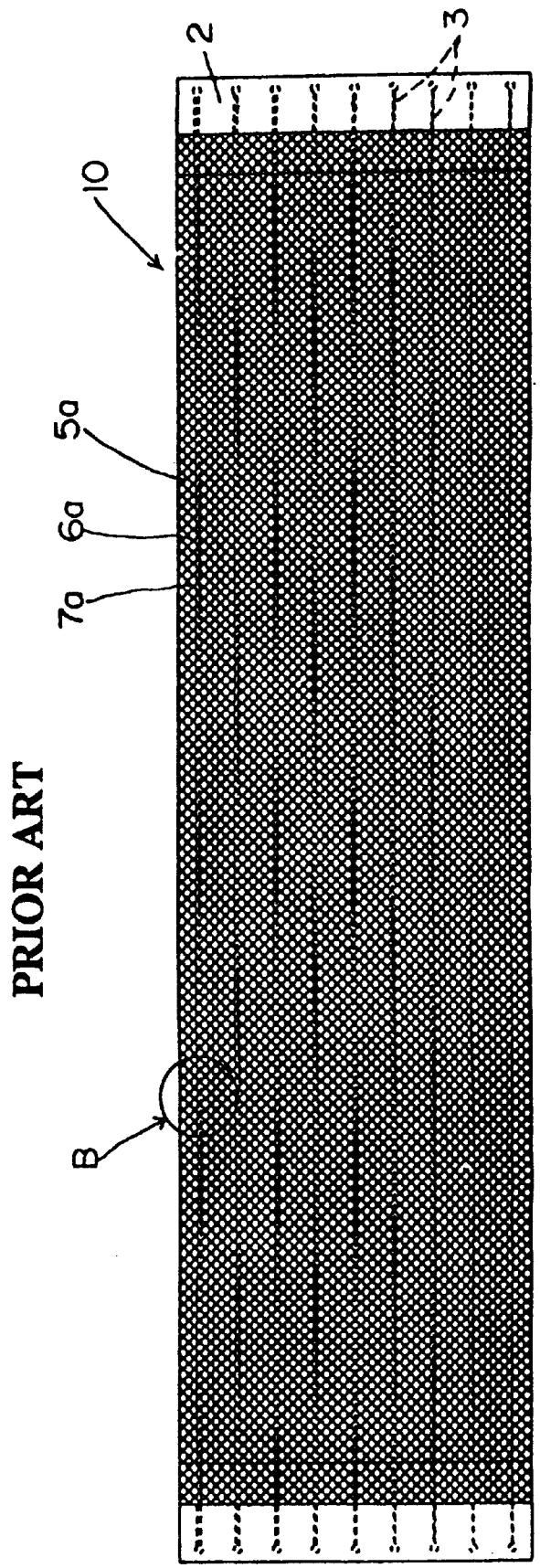
FIG. 3 is a plan view of a flexible printed circuitry according to the prior art.
Figure 4:
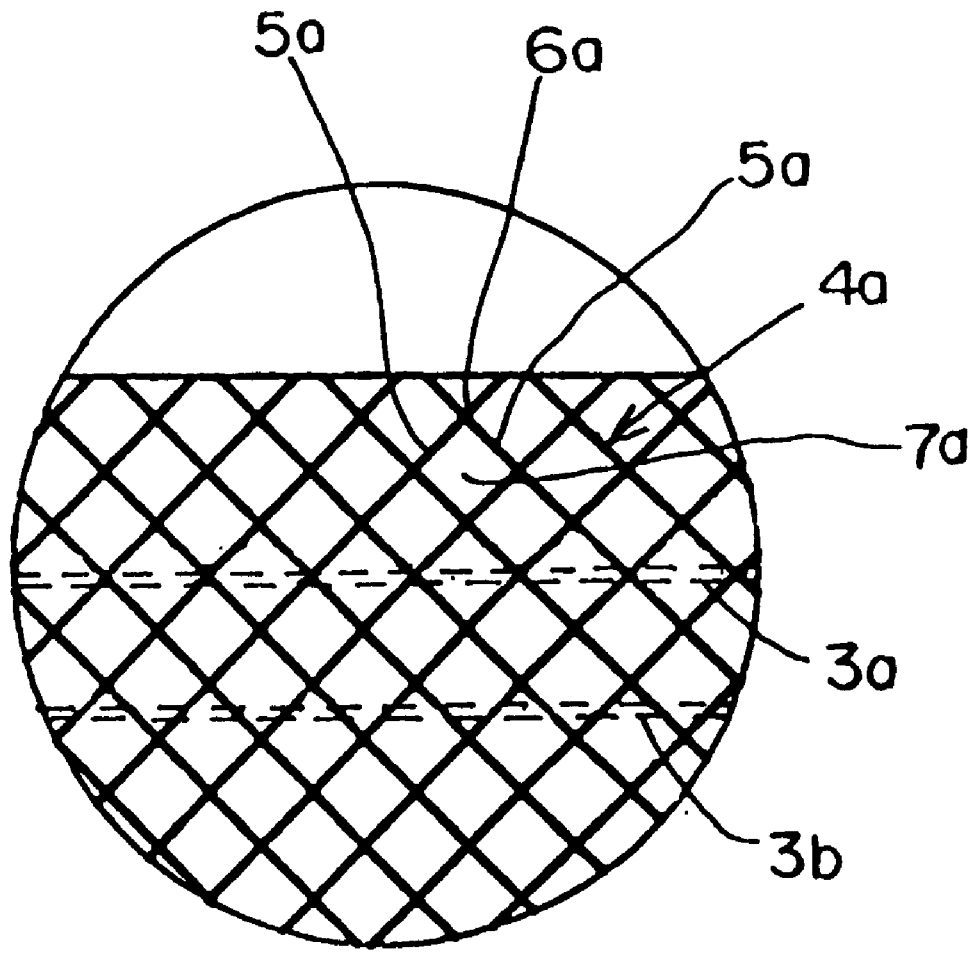
FIG. 4 is an enlarged view of a portion of the flexible printed circuitry circled and indicated at "B" in FIG. 3.

In contrast, FIGS. 3 and 4 show flexible printed circuitry, generally designated 10, according to the prior art. Again, signal conductors 3 run parallel to each other on one side of substrate 2 and a grounding grid 4a is disposed on the opposite side of the substrate.

As best seen in FIG. 4, grounding grid 4a of the prior art includes a plurality of ground conductors 5a defining intersections 6a, with open spaces 7a therebetween. The ground conductors and their intersections are in a predetermined repeating pattern to define a regular pattern of equally shaped and equally sized open spaces 7a.

A problem with the prior art grounding grid 4a is best exemplified by comparing signal conductors 3a and 3b in FIG. 4. signal conductor 3a extends longitudinally of the FPC and crosses the intersections 6a between ground conductors 5a at regular intervals or in a regular repeating sequence lengthwise of the FPC. On the other hand, signal conductor 3b traverses ground conductors 5a at locations spaced from intersections 6a, in a regular repeating sequence lengthwise of the FPC. Each time one of the signal conductors 3a,3b crosses a ground conductor, the signal conductor incurs a drop in impedance. Therefore, whenever signal conductor 3a crosses intersections 6a, there is a drop in impedance, and whenever signal conductor 3b crosses ground conductors 5a there is a drop in impedance. However, signal conductor 3b crosses twice as many ground conductors as signal conductor 3a will cross intersections between the ground conductors, causing twice as many "drops" or reductions in impedance for signal conductor 3b as for signal conductor 3a. The result is that the overall impedance along the length of signal conductor 3b is less than the overall impedance of the same length of signal conductor 3a.

In other words, with the regular geometric pattern of the prior art grounding grid 4a, each signal conductor 3a or 3b crosses ground conductors 5a in a regular recurring intervals lengthwise of the FPC, but the intervals are different for each of the signal conductors spaced apart transversely of the FPC. As a result, conductors 3a and 3b will have different impedance characteristics along the length of FPC 10.

On the other hand, with the irregular or random geometric pattern of ground conductors 5 of grounding grid 4 according to the present invention (FIG. 2), each signal conductor 3 traverses the ground conductors at irregular intervals lengthwise of the cable with the result that, according to the law of random statistics, the randomly-distributed capacitances provide substantially constant impedance for signal conductors 3 lengthwise of FPC 10. This permits structure facilitates improved high speed transmission of signals by conductors 3.

Another problem with regular patterned grounding grids involves an FPC design wherein a signal conductor might not travel in a straight line from one end of the cable to the opposite end. It has been pointed out in considerable detail above that the impedance can vary from one signal conductor to another in an FPC with the prior art regular patterned grounding grid. In addition, if a signal conductor changes its path lengthwise of the FPC, the position of that conductor in the pattern or relative to the grid intersections also changes. This will change the impedance of the signal conductor at various points along its length. By utilizing the present invention with the random pattern grounding grid, the impedance for any given length of any given conductor will be substantially the same regardless of its position on the grid. As a result, changes in the direction of signal conductor 3 will not affect the impedance of the signal conductor.

It will be understood that the invention may be embodied in other specific forms without departing from the spirit or central characteristics thereof. The present examples and embodiments, therefore, are to be considered in all respects as illustrative and not restrictive, and the invention is not to be limited to the details given herein.

We claim:
1. A flexible printed circuitry member, comprising:
   an elongated flexible insulating substrate;
   a plurality of first conductors being deposited on and extending longitudinally along one side of the insulating substrate; and
   a conductive grounding grid being deposited on the insulating substrate on a side opposite said one side of the insulating substrate, the grounding grid having a substantially random geometric pattern.
2. The flexible printed circuitry member of claim 1 wherein said grounding grid covers substantially the entirety of the insulating substrate.
3. The flexible printed circuitry member of claim 1 wherein said first conductors extend generally parallel to each other longitudinally of the insulating substrate.
4. The flexible printed circuitry member of claim 1 wherein said grounding grid comprises a plurality of intersecting conductors defining substantially randomly unequal-in-shape open spaces therebetween.
5. The flexible printed circuitry member of claim 1 wherein said grounding grid comprises a plurality of intersecting conductors defining substantially randomly unequal-in-size open spaces therebetween.
6. The flexible printed circuitry member of claim 1 wherein said grounding grid comprises a plurality of conductors defining a plurality of intersections, the intersections being in a substantially random pattern.
7. The flexible printed circuitry member of claim 1 wherein said grounding grid comprises a plurality of intersecting conductors defining open spaces therebetween, said open spaces being substantially randomly unequal-in-shape and substantially randomly unequal-in-size.
8. A flexible printed circuitry member comprising:
   an elongated flexible insulating substrate;
   a plurality of generally parallel signal conductors being deposited on and extending longitudinally along one side of the insulating substrate; and
   a conductive grounding grid being deposited on the insulating substrate on an opposite side of the insulating substrate, the grounding grid having a substantially random geometric pattern.
9. The flexible printed circuitry member of claim 8 wherein said grounding grid covers substantially the entirety of the insulating substrate.

10. The flexible printed circuitry member of claim 8 wherein said grounding grid comprises a plurality of intersecting ground conductors defining substantially randomly unequal-in-shape open spaces therebetween.

11. The flexible printed circuitry member of claim 8 wherein said grounding grid comprises a plurality of intersecting ground conductors defining substantially randomly unequal-in-size open spaces therebetween.

12. The flexible printed circuitry member of claim 8 wherein said grounding grid comprises a plurality of ground conductors defining a plurality of intersections, the intersections being in a substantially random pattern.

13. A flexible printed circuitry member, comprising:

an elongated flexible insulating substrate;

a plurality of first conductors being deposited on and extending longitudinally along one side of the insulating a conductive grounding grid being deposited on the insulating substrate on a side opposite said one side of the insulating substrate, the grounding grid having a substantially random geometric pattern, said grounding grid including a plurality of intersecting conductors defining substantially randomly unequal-in-shape open spaces therebetween.

14. The flexible printed circuitry member of claim 13 wherein said grounding grid covers substantially the entirety of the insulating substrate.

15. The flexible printed circuitry member of claim 13 wherein said first conductors extend generally parallel to each other longitudinally of the insulating substrate.

16. The flexible printed circuitry member of claim 13 wherein said plurality of intersecting conductors further defines substantially randomly unequal-in-size open spaces therebetween.

17. The flexible printed circuitry member of claim 1 wherein said plurality of conductors defining a plurality of intersections, the intersections being in a substantially random pattern.

* * * * *